(12) United States Patent
Kerber et al.

(10) Patent No.: US 10,126,354 B1
(45) Date of Patent: Nov. 13, 2018

(54) ASSESSMENT OF HCI IN LOGIC CIRCUITS BASED ON AC STRESS IN DISCRETE FETS

(71) Applicant: GLOBALFOUNDRIES INC., Grand Cayman (KY)

(72) Inventors: Andreas Kerber, Mount Kisco, NY (US); Tanya Nigam, Sunnyvale, CA (US); Fernando Guarin, Millbrook, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/635,711

(22) Filed: Jun. 28, 2017

(51) Int. Cl.
*G01R 31/26* (2014.01)
*G01R 31/28* (2006.01)
*H01L 27/092* (2006.01)
*H01L 27/118* (2006.01)

(52) U.S. Cl.
CPC ..... *G01R 31/2639* (2013.01); *G01R 31/2855* (2013.01); *H01L 27/092* (2013.01); *H01L 27/11807* (2013.01)

(58) Field of Classification Search
CPC .................................................. G01R 31/2639
See application file for complete search history.

(56) References Cited

U.S. PATENT DOCUMENTS

| | | | |
|---|---|---|---|
| 6,873,932 B1 * | 3/2005 | Kim .................. | G01R 31/287 702/182 |
| 7,495,519 B2 | 2/2009 | Kim et al. | |
| 8,099,269 B2 | 1/2012 | Topaloglu et al. | |
| 8,229,683 B2 | 7/2012 | Gebara et al. | |
| 9,159,803 B2 | 10/2015 | Min et al. | |
| 9,494,641 B2 | 11/2016 | Smith et al. | |
| 2010/0156454 A1 * | 6/2010 | Weir .................. | G01R 31/2648 324/762.08 |
| 2013/0280873 A1 | 10/2013 | Erben et al. | |

OTHER PUBLICATIONS

Hot Carrier Degradation. http://www.iue.tuwien.ac.at/phd/entner/node21.html. pp. 1-4. Accessed on May 1, 2017.

(Continued)

*Primary Examiner* — Clayton E Laballe
*Assistant Examiner* — Jas Sanghera
(74) *Attorney, Agent, or Firm* — Gibb & Riley, LLC; Michael J. LeStrange, Esq.

(57) ABSTRACT

CMOS switching devices are connected to testing equipment that applies AC to stress the CMOS switching devices. The testing equipment varies rise and fall times of drain and gate voltages, and varies offsets of the drain and gate voltages of the CMOS switching devices. The amount of hot carrier injection (HCI) within the CMOS switching devices is measured when the rise and fall times of the drain and gate voltages cross over, to establish AC HCI contribution to device degradation of the CMOS switching devices. Further, these methods can correlate the AC HCI contribution of the CMOS switching devices to CMOS logic devices based on ring oscillator (RO) degradation of ROs similarly tested or simulated, to produce AC HCI contribution for the CMOS logic devices.

20 Claims, 16 Drawing Sheets

(56) References Cited

OTHER PUBLICATIONS

Yoshinobu Nakagome, Eiji Takeda, Hitoshi Kume and Shojiro Asai. New Observation of Hot-Carrier Injection Phenomena. Proceedings of the 14th Conference (1982 International) on Solid State Devices, Tokyo, 1982; Japanese Journal of Applied Physics, vol. 22 (1983) Supplement 22-1, pp. 99-102.

Manish Prabhakar Pagey. Characterization and Modeling of Hot-Carrier Degradation in Sub-Micron NMOSFETS. 2002. Graduate School of Vanderbilt University, Nashville, TN, USA. pp. 46-49.

P. Heremans, R. Bellens, G. Groeseneken, H. E Maes. Consistent Model for the Hot-Carrier Degradation in n-Channel and p-Channel MOSFET's, IEEE Trans. Electron Devices, vol. 35, No. 12, pp. 2194-2209, 1988.

P. Fang, J. Tao, J. F. Chen, C. Hu. Design in Hot-Carrier Reliability for Higher Performance Logic Applications. IEEE Custom Integrated Circuits Conference, pp. 525-531, 1998.

S. Mahapatra, V. Huard, A. Kerber, V. Reddy, S. Kalpat & A. Haggag. Universality of NBTI—From Devices to Circuits and Products. IRPS pp. 3B.1.1-3B.1.8, 2014.

E. Li, E. Rosenbaum, J. Tao, G. C. F. Yeap, M. R. Lin & P. Fang. Hot Carrier Effects in nMOSFETs in 0.1mm CMOS Technology. IRPS pp. 253-258, 1999.

A. Kerber & T. Nigam. Application of CVS and VRS method for correlation of logic CMOS wear out to discrete device degradation based on Ring Oscillator circuits. IEEE VLSI Technology Symposium, pp. 44-45, 2016.

T. Nigam, B. Parameshwaran & G. Krause. Accurate product lifetime predictions based on device-level measurements. IRPS, pp. 634-639, 2009.

A. Kerber, X. Wan, Y. Liu & T. Nigam. Fast wafer-level stress-and-sense methodology for characterization of Ring-Oscillator degradation in advanced CMOS technologies. IEEE Trans. Electron Devices, vol. 62, No. 5, pp. 1427-1432, 2015.

\* cited by examiner

ASSESSMENT OF HCI IN LOGIC CIRCUITS BASED ON AC STRESS IN DISCRETE FETS

BACKGROUND

Field of the Invention

The present disclosure relates to methods and systems for testing manufactured transistors, and more specifically, to such that determine the contribution hot carrier injection makes to device degradation.

Description of Related Art

A number of measures can be used to test manufactured devices, such as circuits that include transistors. For example, bias temperature instability (BTI) and hot carrier injection, in conducting (HCI or c-HCI) or non-conducting (nc-HCI) mode, are transistor device degradation mechanisms that are often evaluated with scaled CMOS technologies. While BTI has dominated the frequency degradation in CMOS circuits for scaled nodes, HCI impact also should have careful review to ensure long term product reliability, as the time exponent for HCI (~0.4) is double that of BTI (~0.2). To assess the HCI contribution in logic circuits operating at frequencies in the GHz range, it is useful to decouple BTI and HCI degradation under both DC and AC operation.

SUMMARY

Various methods herein connect complementary metal oxide semiconductor (CMOS) switching devices to testing equipment, and apply alternating current (AC) to stress the CMOS switching devices using the testing equipment. The methods herein control the testing equipment to cause, in response to applied AC, variations in rise and fall times of drain and gate voltages of the switching devices and variations in offsets of the drain and gate voltages (independently of one another). For example, the testing equipment can vary the rise and fall times, and the offsets, of the drain and gate voltages (independently of each other) using synchronized sense amplifier units. Similarly, the testing equipment can be controlled to independently vary the frequency of the AC applied to the CMOS switching devices.

Thus, such methods can measure the amount of hot carrier injection (HCI) within the CMOS switching devices when the rise and fall times of the drain and gate voltages cross over, to establish AC HCI contribution to device degradation of the CMOS switching devices. The drain and gate voltages cross over at the point where the testing equipment applies the same voltage to drains and gates of the CMOS switching devices, and this is the point at which the highest AC stress voltage is applied to the CMOS switching devices.

Since the rise and fall times, and the offsets, of the drain and gate voltages are varied independently of one another, this produces a range of cross-over voltages at which the drain and gate voltages cross over; and this allows the methods to establish a range of AC HCI contributions for the range of cross-over voltages. The process of establishing the AC HCI contribution can, for example, take an integral of cross-over voltages within the range of cross-over voltages. Also, the measurement of the amount of HCI can be performed for p-type field effect transistor devices (pFETs) and n-type field effect transistor devices (nFETs), to establish the AC HCI contribution separately for the pFETs and nFETs.

Further, these methods can correlate the AC HCI contribution of the CMOS switching devices to CMOS logic devices based on ring oscillator (RO) degradation of ROs similarly tested or simulated under the same conditions and inputs, to produce AC HCI contribution for the CMOS logic devices; and the AC HCI contribution for the CMOS switching devices and/or the AC HCI contribution for the CMOS logic devices can be output from the testing equipment.

Various testing systems herein include (among other components) testing equipment, a controller connected to the testing equipment, an input/output connected to the controller, etc. The testing equipment is connectable to devices under test, such as transistors, and more particularly to field effect transistors or FETs (e.g., CMOS switching devices), and the testing equipment is capable of applying AC to stress the CMOS switching devices. The controller is capable of controlling the testing equipment to cause, in response to applied AC, variations in rise and fall times of drain and gate voltages of the switching devices and variations in offsets of the drain and gate voltages (independently of one another). For example, the testing equipment can include synchronized sense amplifier units that are capable of varying the rise and fall times of the drain and gate voltages, and varying the offsets of the drain and gate voltages.

Additionally, the controller is capable of measuring the amount of HCI within the CMOS switching devices when the rise and fall times of the drain and gate voltages cross over, to establish AC HCI contribution to device degradation of the CMOS switching devices. The drain and gate voltages cross over at the point where the testing equipment applies the same voltage to drains and gates of the CMOS switching devices, which is the voltage at which the highest AC stress voltage is applied to the CMOS switching devices.

Because the controller controls the testing equipment to vary the rise and fall times, and the offsets, of the drain and gate voltages (independently of one another), this produces a range of cross-over voltages, to establish a range of AC HCI contributions for the range of cross-over voltages (e.g., by taking an integral of cross-over voltages within the range of cross-over voltages). Also, the controller is capable of measuring the amount of HCI for p-type field effect transistor devices (pFETs) and n-type field effect transistor devices (nFETs), to establish the AC HCI contribution separately for the pFETs and nFETs of the CMOS switching devices.

Additionally, the controller is capable of correlating the AC HCI contribution of the CMOS switching devices to CMOS logic devices based on ring oscillator (RO) degradation of ROs similarly tested under the same conditions and inputs, to produce AC HCI contribution for the CMOS logic devices. The input/output is capable of outputting the AC HCI contribution for the CMOS switching devices and/or the AC HCI contribution for the CMOS logic devices from the testing equipment.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, it is useful to decouple BTI and HCI degradation under both DC and AC operation. Since HCI occurs only during circuit switching, it is beneficial to understand the HCI contribution from both nFET and pFET using an AC stress on discrete devices. To address such issues, the systems and methods herein provide an AC hot carrier injection (HCI) test methodology replicating the switching in digital CMOS circuits, which is introduced to correlate HCI in discrete scaled CMOS devices to HCI in logic circuits. This technique allows the systems and methods to demonstrate that the historic 50× reduction for HCI lifetime for mid-Vg stress in scaled devices should be uplifted to 1000× or more based on the correlation with ring oscillator (RO) degradation. This brings significant HCI relief for device optimization in advanced technology nodes.

The systems and methods described herein bridge the existing gap between DC and AC HCI models using an AC HCI technique that allows a user to vary the rise and fall time along with the drain to gate offset independently, to determine the HCI contribution for circuits with different load. Measured AC HCI data is then correlated with a typical RO degradation switching at GHz, and additional AC relief is demonstrated for scaled devices, lifting the pressure from device optimization.

Figure 1:
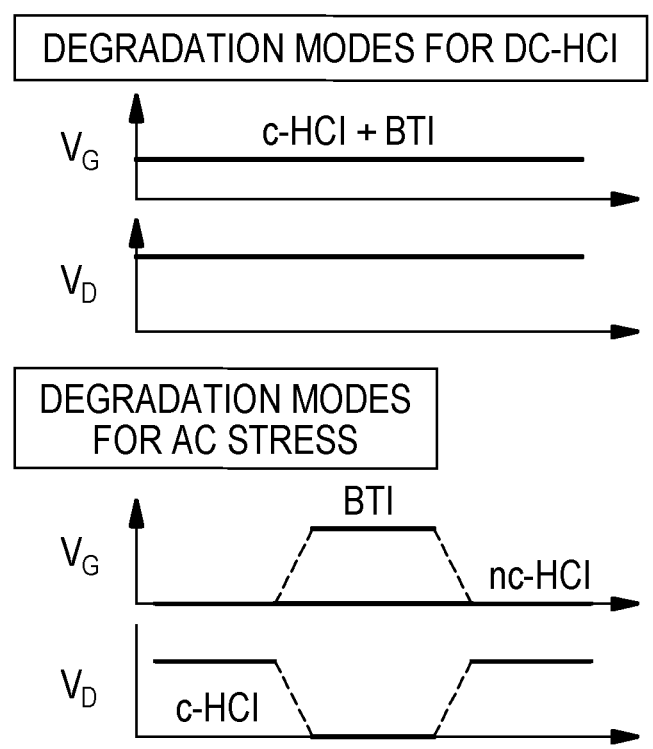
FIG. 1 shows graphs illustrating voltage time trace and degradation modes.

More specifically, with processing herein, discrete core and input/output (TO) transistors (for example, based on replacement metal gate (RMG) bulk-FinFET technology, gate-first (GF) metal gate/high-k (MG/HK) technology, poly-Si/SiON CMOS technology, etc.) can be subjected to DC and AC HCI/BTI stress. During such, the devices can be stressed under the stringent temperature for DC HCI (e.g., T=125° C. for core and T=30° C. for IO) to enhance HCI damage. Additionally, ring oscillators can be stressed at elevated bias to enhance the HCI contribution for core device in both poly-Si/SiON and bulk FinFET devices. The various degradation components during such DC device and AC RO stressing is schematically depicted in FIG. 1. More specifically, FIG. 1 illustrates schematic voltage time trace and degradation modes for the DC-HCI stress test for a "mid-Vd" condition, and degradation modes for AC stress in logic CMOS circuits. Non-conducting hot carrier injection (nc-HCI) and BTI can potentially contribute to degradation in addition to the conducting hot carrier injection (c-HCI).

Figure 2:
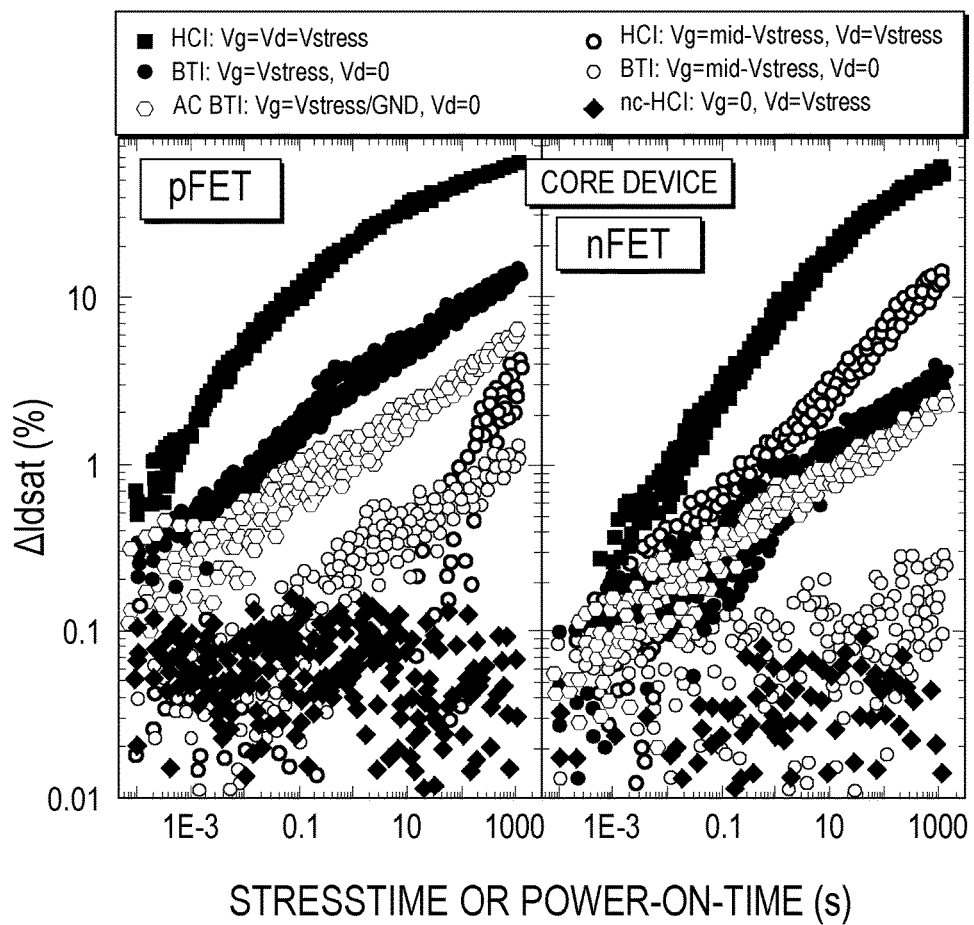
FIG. 2 shows graphs illustrating core device HCI and BTI degradation.

In addition to the HCI degradation, digital CMOS circuits also experience BTI and potentially nc-HCI. The impact of the various stress modes on bulk FinFET devices are shown in FIG. 2. Thus, FIG. 2 compares core device HCI degradation for Vg=Vd and Vg=mid-Vd stress condition, with corresponding BTI degradation measured in DC and AC conditions. Note that FIG. 2 shows that the non-conducting HCI condition does not cause a measurable degradation and pFET HCI for mid-Vd stress that is impacted by electron trapping. Thus, as shown above, nc-HCI stress does not cause any measurable degradation and can safely be disregarded when discussing device to circuit reliability correlations.

NBTI in pFET devices shows AC effects, while PBTI in nFET devices shows negligible AC recovery. Conducing HCI degradation for both device types exhibits worst-case degradation at Vg=Vd, with initial time slope of 0.45 followed by saturation. Conducting HCI at mid-Vg condition shows significant degradation for nFET with time evolution similar to Vg=Vd; while, for pFET devices, electron trapping at shorter stress time masks the HCI degradation, leading to significantly lower magnitude and steeper time slope. It should be noted that the BTI contributions during DC HCI testing, using Vg=Vd and a mid-Vg test condition, is substantially less and thus may not require a subtraction methodology for the HCI model development.

Figure 3:
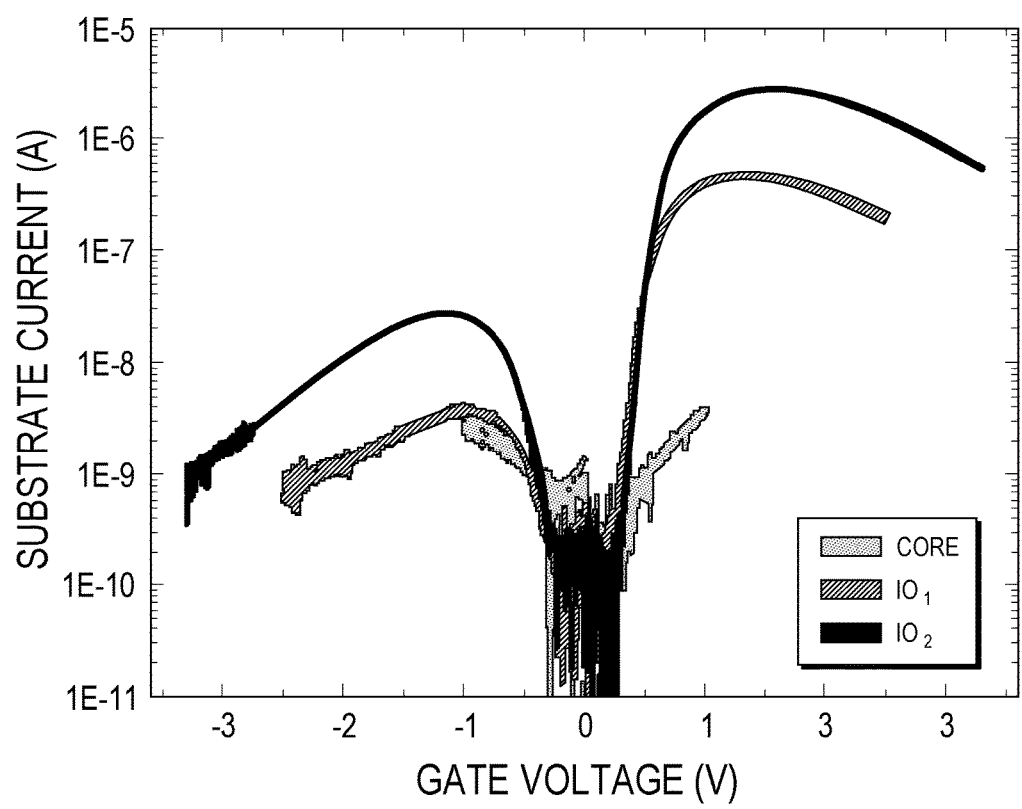
FIG. 3 shows graphs illustrating substrate current of various devices operating in saturation mode.

Since DC HCI at the device level is worst at peak substrate current, the substrate current (Isub) of the various devices operating in saturation mode can be measured and summarized as shown in FIG. 3. More specifically, FIG. 3 is a graph showing the substrate currents versus gate voltage in saturation mode for core and IO devices in bulk MG/HK. In FIG. 3, the substrate current shows a peak for IO devices while for core devices a progressive increase is observed with increasing gate bias. In FIG. 3, the IO devices show a peak in Isub around mid-Vg, indicating maximum carrier generation at reduced gate bias; while core devices for scaled CMOS technologies show the maximum carrier generation at the Vg=Vd condition.

Figure 4:
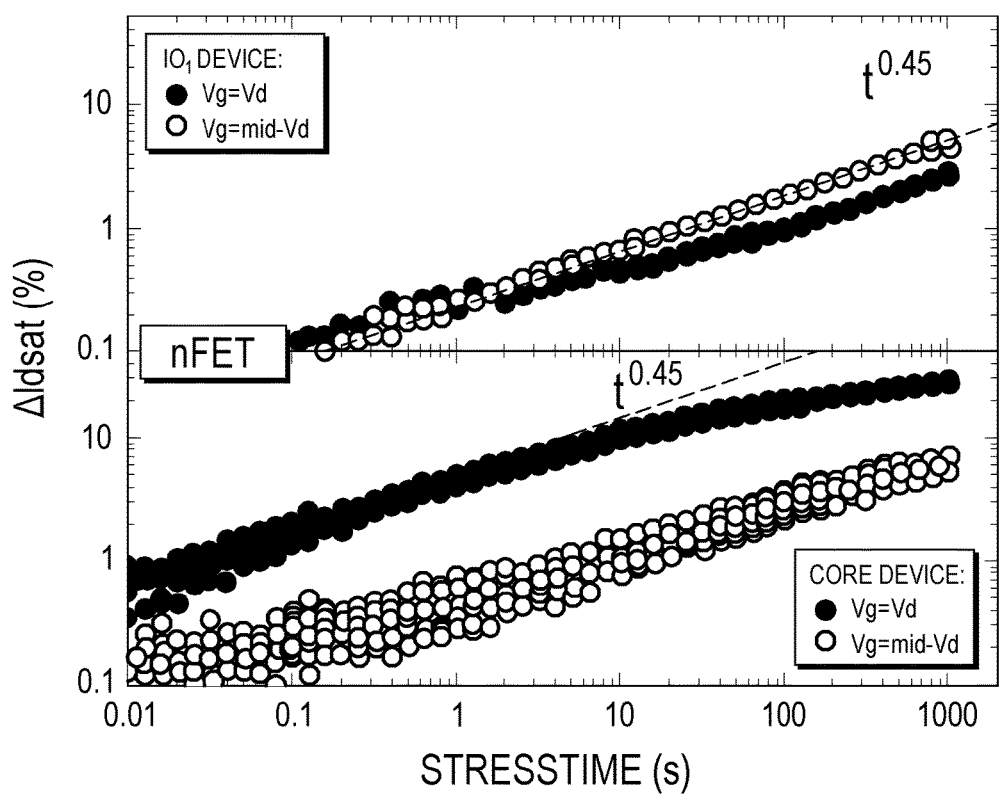
FIG. 4 is a graph illustrating DC conducting HCI degradation.

As shown in FIG. 4, consistent with peak Isub (FIG. 3) worst case HCI degradation for IO devices is observed at mid-Vg and lower temperature, while for core devices at Vg=Vd and higher temperature with time slope n~0.45. FIG. 4 thus shows the DC conducting HCI degradation for 3.3V IO devices and core FinFET devices stressed at the more stringent temperature for degradation. For IO devices, mid-Vg exhibits higher degradation; while core FinFET devices with Vg=Vd shows higher degradation consistent with the maximum substrate currents shown in FIG. 3.

Figure 5:
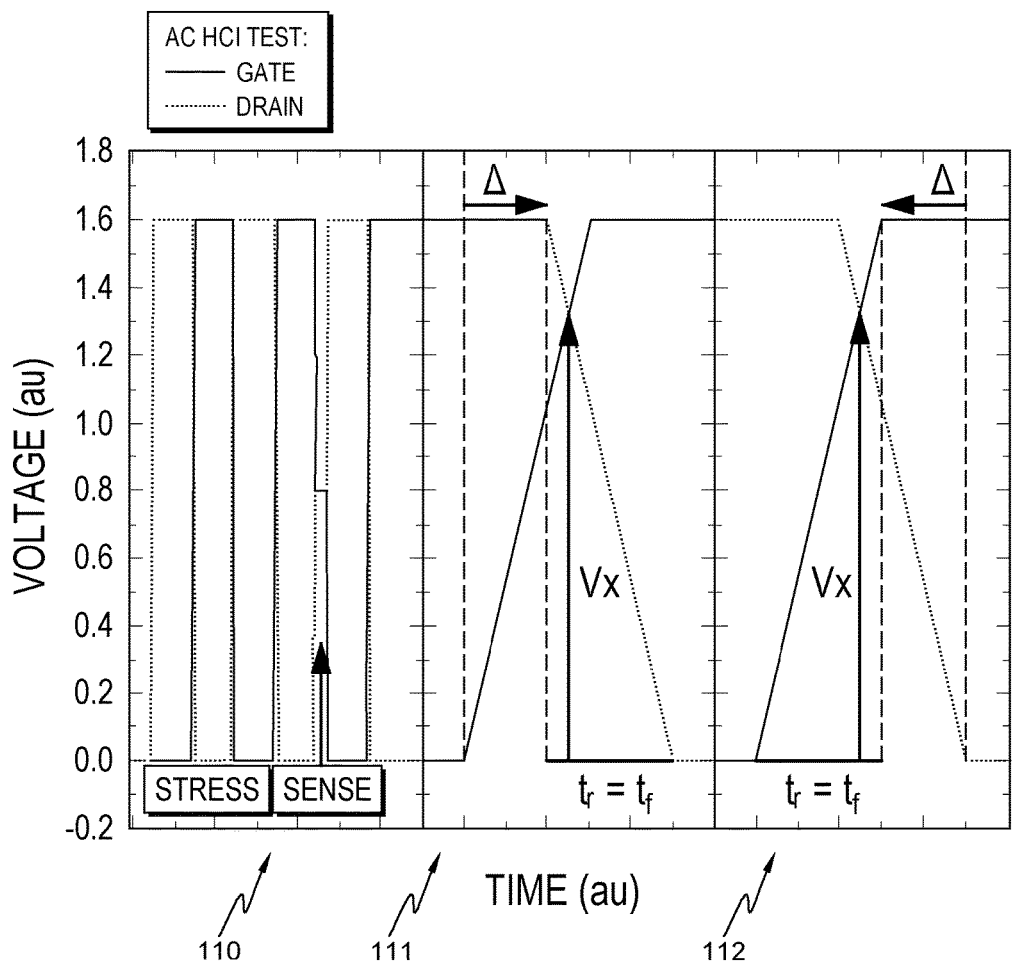
FIG. 5 shows graphs illustrating voltage time traces of the AC HCI test.

To capture the hot carrier degradation caused by switching events in digital CMOS circuits, the systems and methods described herein, introduce an AC HCI test methodology for discrete devices utilizing time resolved digital waveforms with specified frequency, duty cycle, rise (tr) and fall (tf) time. To modulate the HCI degradation, the gate and drain voltage signals are offset by Δ using synchronized remote sense amplifier units, as outlined in FIG. 5, which determines the point (Vx) where the gate and drain voltage cross over. FIG. 5 thus illustrates voltage time traces of the AC HCI test mimicking switching of logic gates (110) with insertion of drain current sense measurement at nominal operation condition in saturation regime. The rise ($t_r$), fall ($t_f$) and offset (Δ) time between gate and drain voltage transitions determine the cross-points, Vx, from gate low to high (111) and high to low (112).

The measured HCI degradation under AC stress, as outlined above, is an integral of various Vg/Vd combinations during the rise and fall transition. Due to the steep voltage acceleration of HCI, the Vx point determines the highest AC stress voltage and is used for AC HCI contribution. For Vx=VDD, the complete Vg is swept at high VDD leading to the worst-case AC HCI, as discussed below. It should be noted that Vx=VDD never occurs in a typical logic circuits, as the circuit load is limited.

Figure 6:
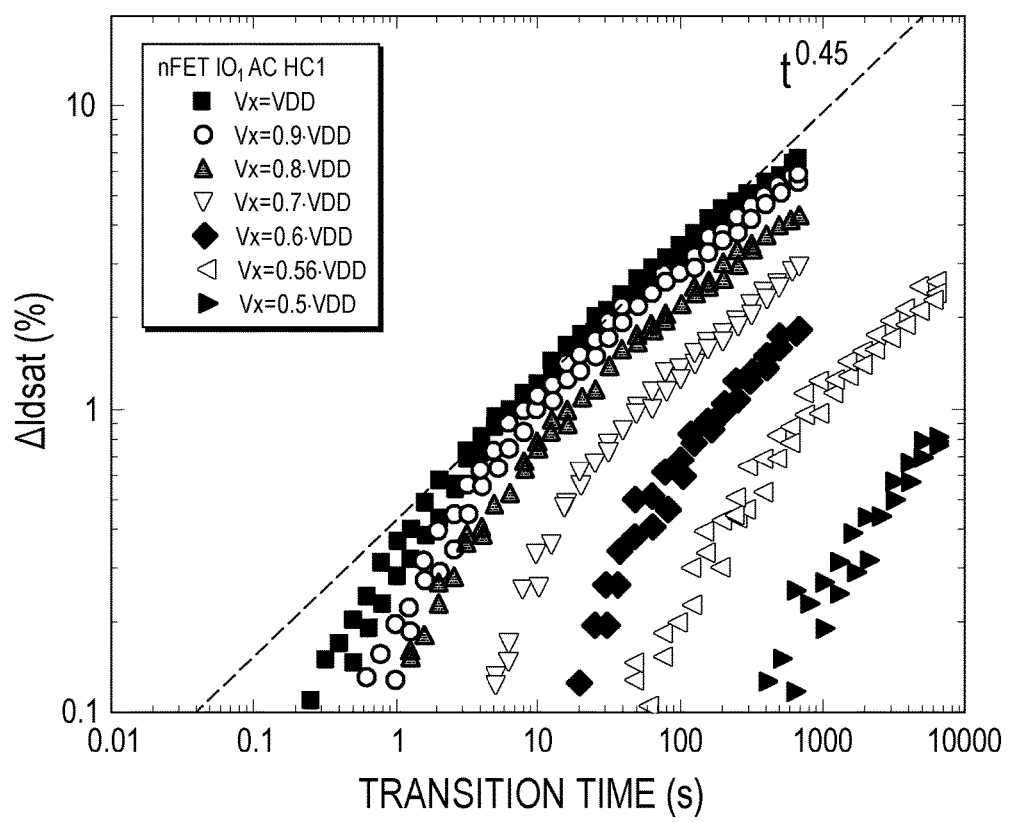
FIG. 6 is a graph illustrating ΔIdsat versus transition time for AC HCI stress with various Vx cross-points.

In one example, nFET IO devices can be stressed using the methodology described above, with various Vx ranging from 0.5•VDD–1•VDD. The measured driving current degradation ($\Delta$Idsat) for AC HCI is plotted versus the cumulative transition time in FIG. 6. Thus, FIG. 6 shows the monotonous decrease in degradation with decreasing Vx cross-point. With this, some observations can be made: 1) AC HCI degradation follows the same power law time evolution (~0.45) as the DC stress shown in FIGS. 4; and 2) the AC HCI degradation monotonically decreases with decreasing Vx value.

Figure 7:
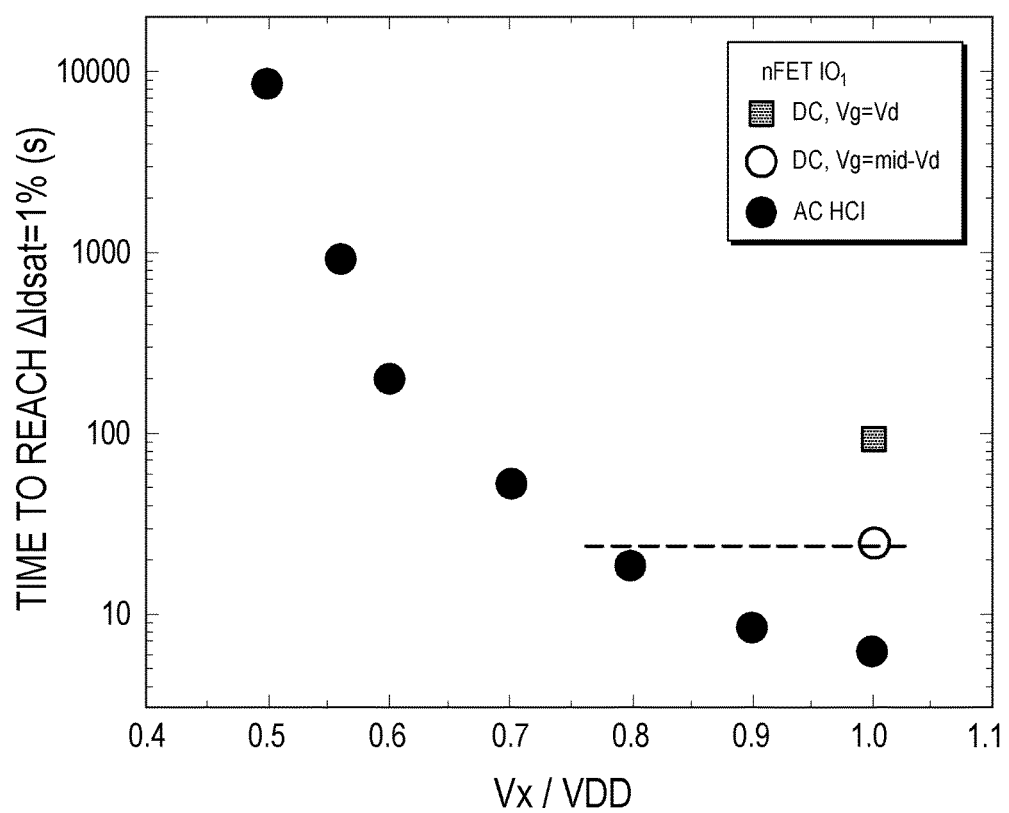
FIG. 7 is a graph illustrating the time at constant degradation versus cross-point ratio.

This leads to a substantial enhancement in the time to reach a $\Delta$Idsat=1% for low Vx switching conditions as shown in FIG. 7. More specifically, FIG. 7 is a graph illustrating the time at constant $\Delta$Idsat degradation versus cross-point ratio (Vx/VDD) for nFET IO device comparing AC HCI to DC stress at Vg=Vd and Vg=mid-Vd stress condition. One item shown by this is that the DC HCI at Vg=Vd is very optimistic and underestimates the AC degradation in an IO. Secondly, an AC HCI test with Vx=0.8•VDD exhibits the same degradation as mid-Vg. Thirdly, Vx=VDD reaches a fixed $\Delta$Idsat at an even shorter time compared to the more stringent mid-Vg DC HCI test. This is because of a combination of two factors: 1) peak substrate current in IO devices is below mid-Vg, leading to higher HCI degradation; and 2) for a chosen waveform offset $\Delta$, the drain voltage remains at VDD while the gate is swept through the entire region of hot carrier generation causing higher degradation.

Figure 8:
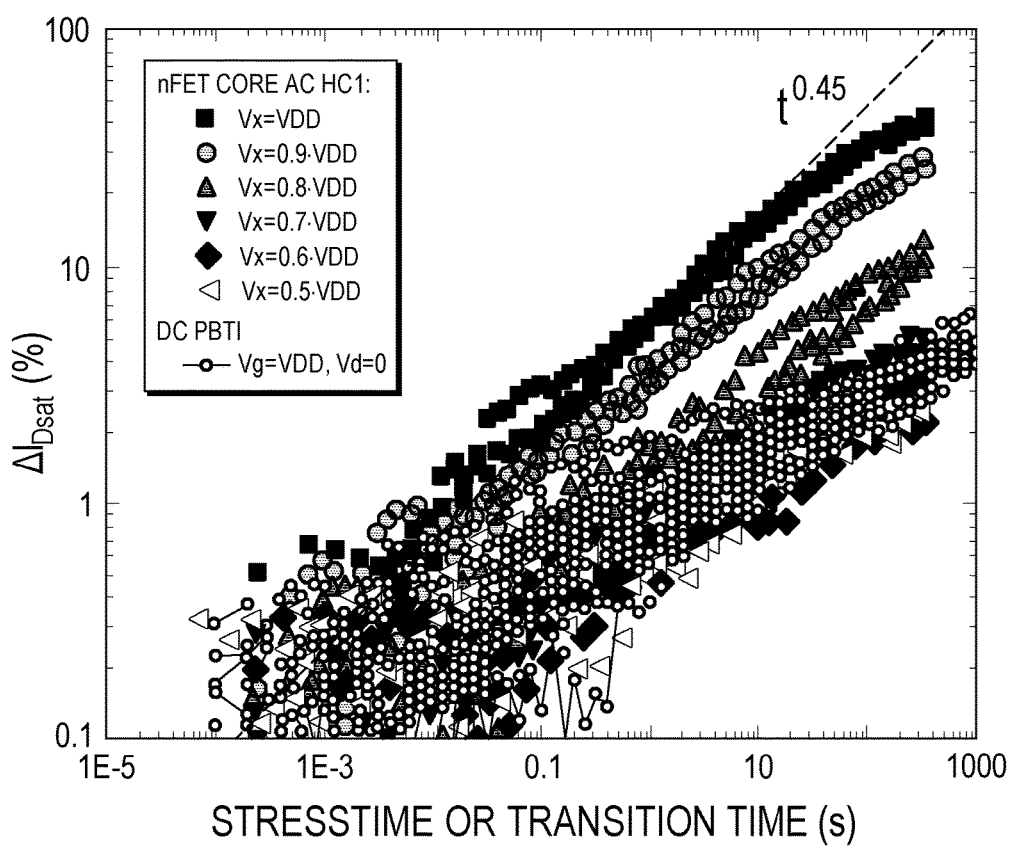
FIG. 8 is a graph illustrating AC HCI stress on core nFET devices.

The AC HCI stress on core nFET devices in bulk FinFET technology are summarized in FIG. 8. FIG. 8 is thus a graph illustrating the $\Delta$Idsat versus transition time for AC HCI stress with various Vx cross-points using core nFET devices. The monotonous decrease in degradation with decreasing Vx cross-point is limited by PBTI. The results shown in FIG. 8 are similar to IO AC HCI with the power law time evolution (n~0.45) and a monotonic decrease in degradation with decreasing Vx.

Figure 9:
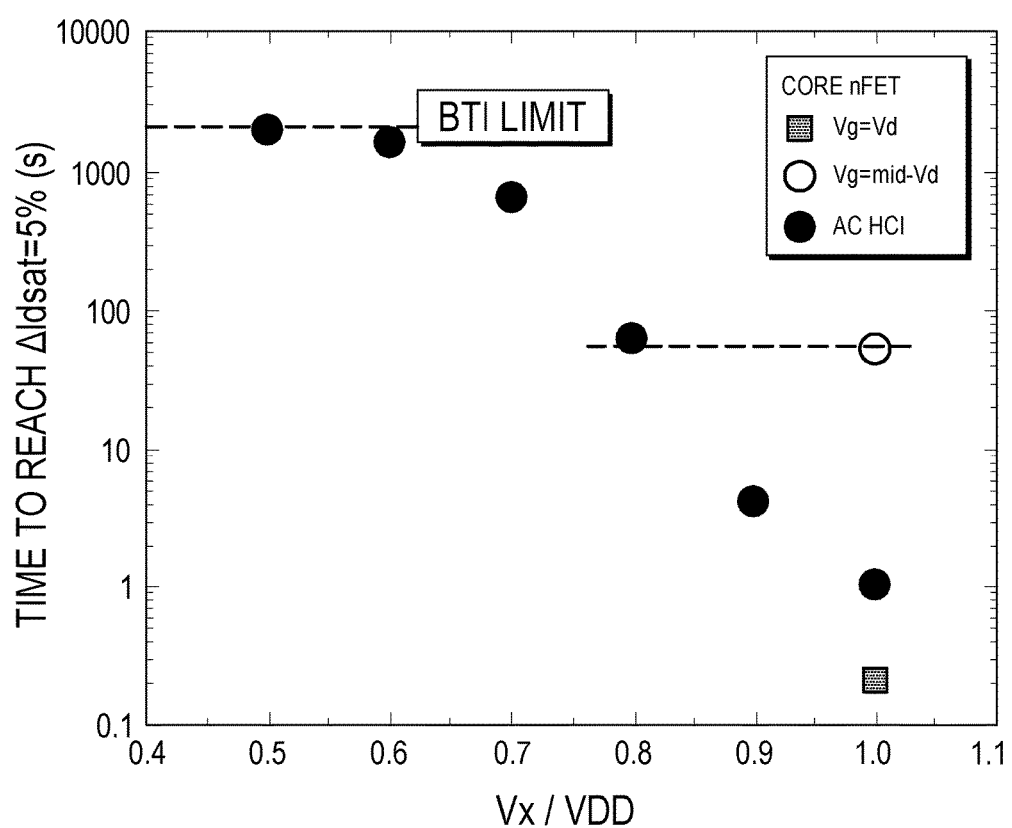
FIG. 9 is a graph illustrating showing that the time at constant ΔIdsat degradation versus cross-point ratio.

For a Vx<0.6•VDD, however, no further reduction in $\Delta$Idsat is seen, since PBTI is dominating the degradation. This is evidenced by plateau seen below Vx=0.6•VDD in FIG. 9. More specifically, FIG. 9 is a graph showing the time at constant $\Delta$Idsat degradation versus cross-point ratio (Vx/VDD) for core nFET device, used for comparing AC HCI to DC stress at Vg=Vd and Vg=mid-Vd stress conditions. Unlike IO devices, Vg=Vd, has the shortest lifetime and is too pessimistic for logic circuit operation. Under AC HCI at Vg=VDD, the HCI lifetime is higher since the device spends only a fraction of the time during the switching event at the high stress condition. The mid-Vg stress condition again shows a comparable degradation to the AC HCI degradation at Vx~0.8•VDD similar to data shown in FIG. 7 for the IO device.

Figure 10:
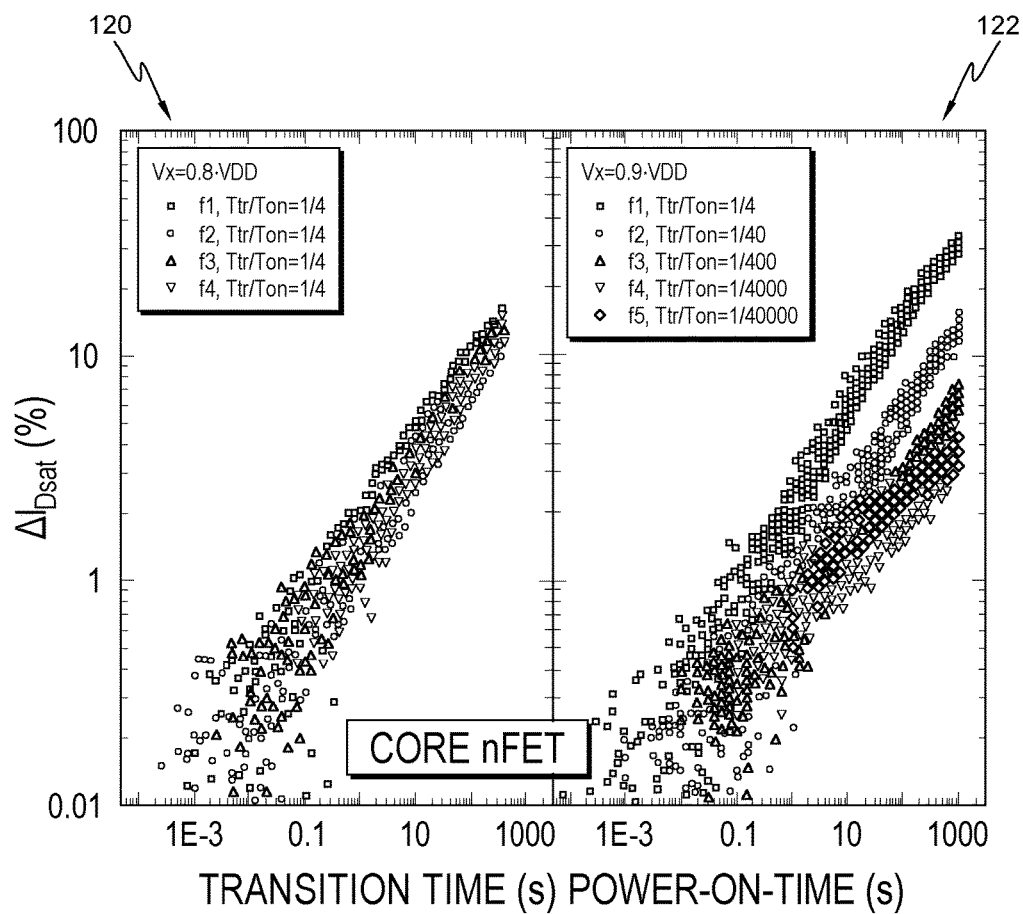
FIG. 10 shows graphs illustrating AC HCI degradation plotted versus transition time.

FIG. 10 is a graph showing the AC HCI degradation plotted versus transition time for a constant rise and fall time over period ratio (120) and versus power-on-time for various frequencies with constant rise and fall time (122). To further extend the AC HCI test methodology, stress experiments at different frequencies can be carried out by either keeping the rise and fall time over period ratio constant (left panel of FIG. 10, item 120) or keeping the rise and fall time constant independent of frequency (right panel of FIG. 10, item 122). When the rise and fall time over period ratio is kept constant, no impact of stress frequency is observed. When the rise and fall time is kept constant and the degradation is plotted versus the power-on-time of the device, an expected increase in degradation is observed with increasing stress frequency.

Figure 11:
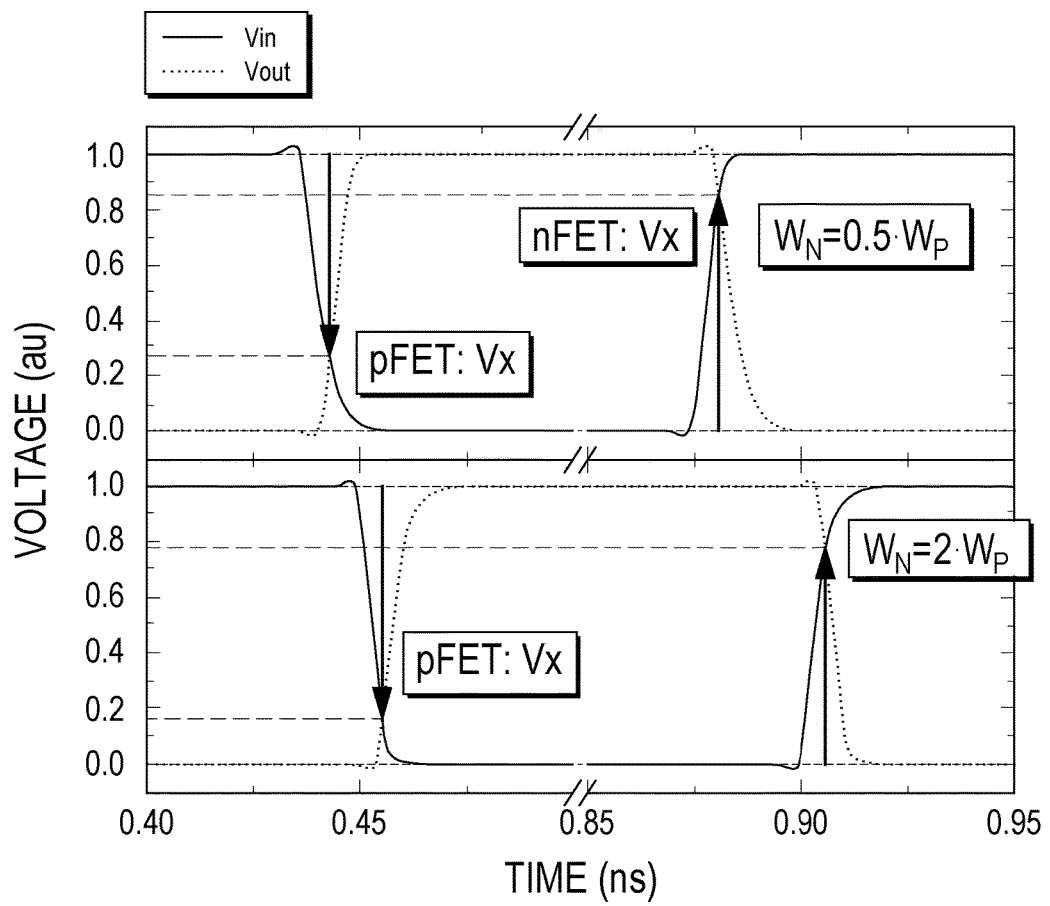
FIG. 11 is a graph illustrating simulated voltage waveforms in an inverter based ring oscillator.

FIG. 11 illustrates, in graph form, the simulated voltage waveforms in an inverter based ring oscillator (e.g., with nFet to pFET ratio of 0.5 and 2, where the Vx cross-point in this example ranges from 0.7 to 0.85). To demonstrate the typical range of Vx in logic circuits, this disclosure provides simulated voltage waveforms for an inverter RO with an asymmetric strength of nFET and pFET devices (e.g., having a ratio of 0.5 and 2) in FIG. 11. As can be seen when the pFET device is strong (upper panel of FIG. 11) the pFET crossover point Vx is 0.75•VDD compared to the case of a weak pFET (0.85•VDD) and vice versa for nFET devices. This indicates that mid-Vg DC HCI with lifetime similar to Vx=0.8•VDD is a good reference for AC HCI contribution in an RO. Thus, the systems and methods herein can predict the HCI contribution in RO frequency degradation by accounting for the switching time and stress frequency to extract the total mid-Vg stress time.

Figure 12:
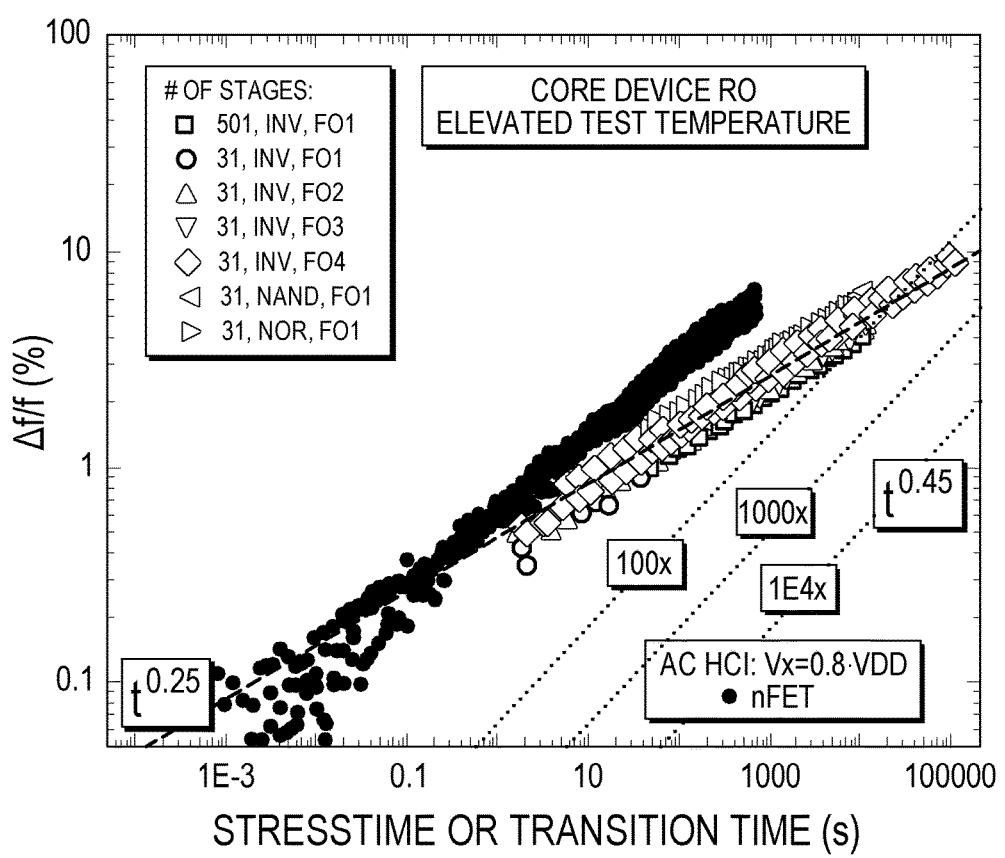
FIGS. 12 and 13 are graphs illustrating frequency degradation for various ring oscillators compared to projected core transistor HCI impact.
Figure 13:
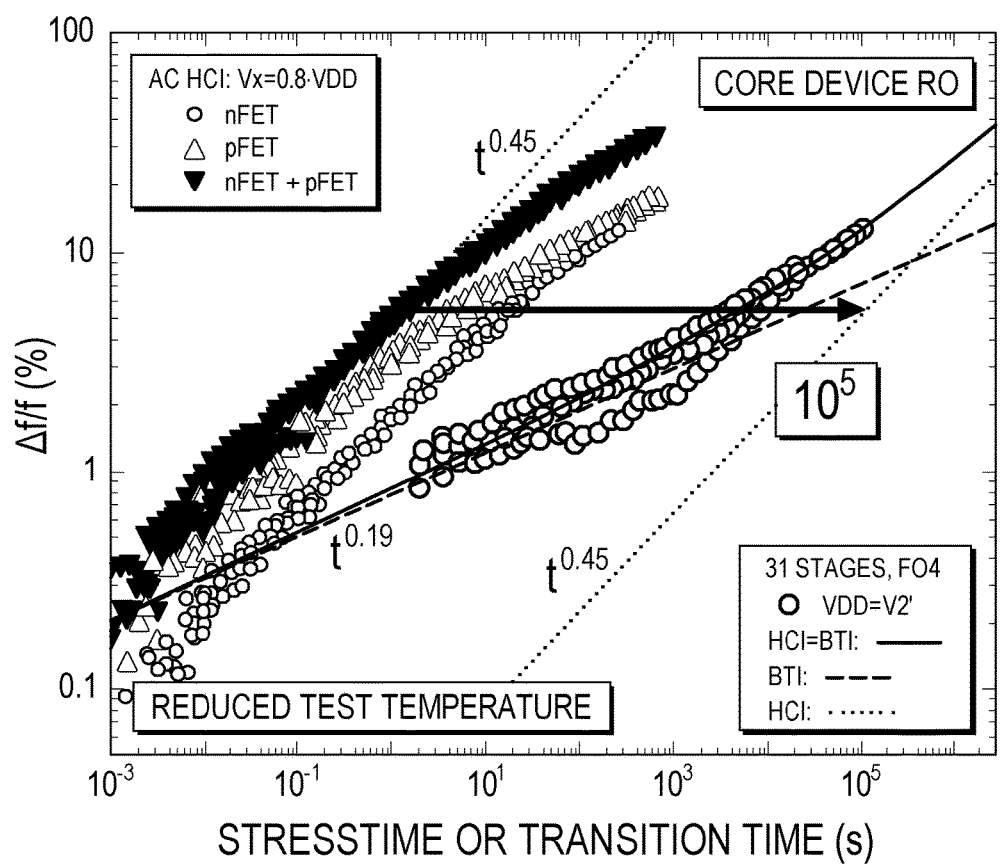

An observation is made for the 31 stage inverter RO circuits with different fan-outs ranging from 1 to 4, and for the NAND and NOR based RO degradation stressed up to 100 ks at elevated temperature, as summarized in FIG. 12. More specifically, FIG. 12 is a graph showing the frequency degradation for various ring oscillators (inverter, NAND and NOR) compared to the projected core nFET AC HCI impact for a Vx cross-point of 0.8. FIG. 12 shows that there is negligible impact of inverter load (fan-out of 1 to 4); circuit type on frequency degradation is shown; and there is no shown increase in time-slope, suggesting the lower bound for nFET AC HCI device to circuit gap is >1000x. Based on mid-Vg stress and typical transition time, HCI degradation contribution with a higher time slope is expected for highest voltage between 1 ks-10 ks. Lack of HCI signal in RO frequency degradation indicates additional HCI relief is present in scaled devices. FIG. 13 illustrates the same for a reduced test temperature where HCI contribution can actually be observed in the RO frequency degradation. In this example RO stresstime ratio to the discrete device transition time ratio is $10^5$x.

Therefore, this above presents an AC HCI stress methodology to measure HCI degradation in discrete devices, mimicking switching in logic CMOS circuits. This allows a user to modulate the HCI contribution by adjusting the gate and drain waveform offsets, which determines the cross-point (Vx) of Vg and Vd during circuit switching. The AC HCI test at Vx~0.8•VDD, which is representative of a typical RO circuit, yields an equivalent lifetime as the mid-Vg HCI stress, which is the basis of DC HCI stress during technology qualification of older nodes. Based on the RO and AC HCI data this demonstrates that the 50x reduction for scaled devices is very conservative from a mid-Vg condition, and the new DC HCI target can be reduced by 1000x or more based on RO correlation.

Figure 14:
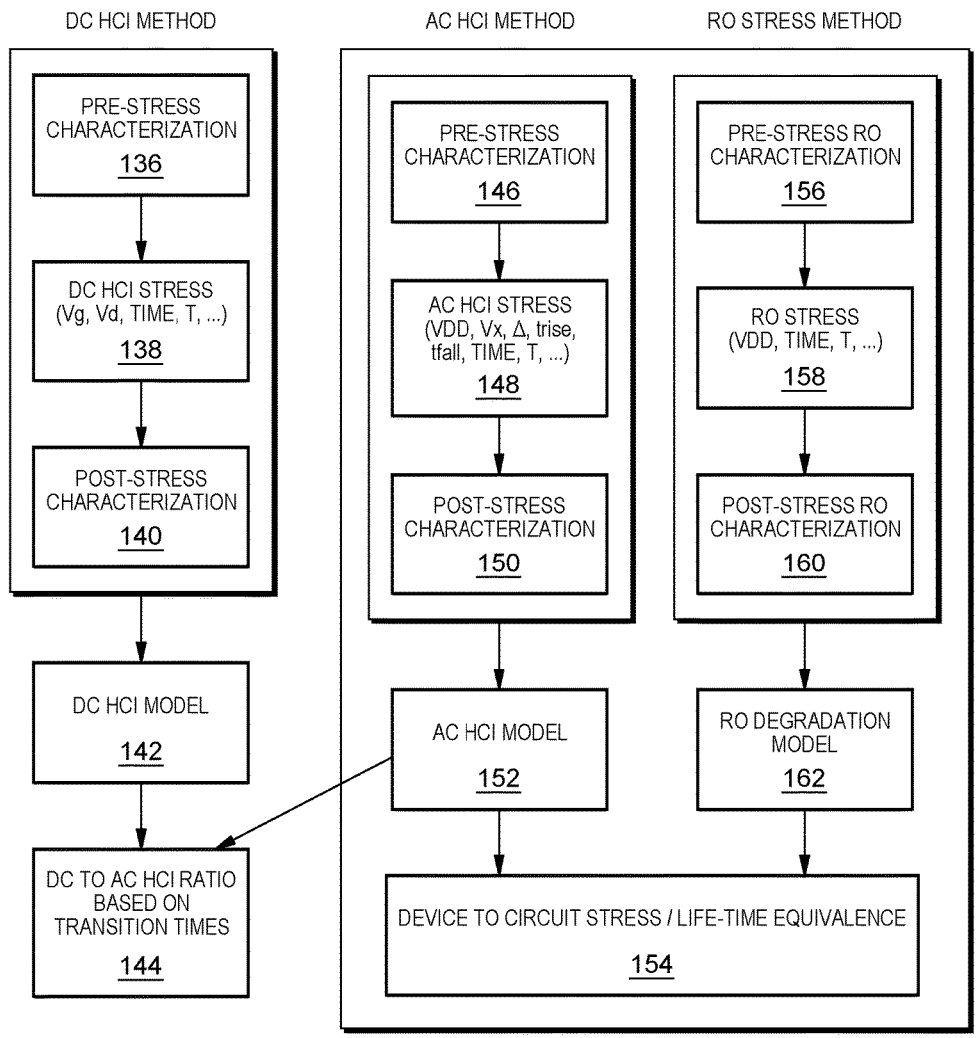
FIGS. 14 and 15 are flow diagrams illustrating embodiments herein.

FIG. 14 is a flowchart showing the DC HCI method (136-144); the AC HCI method (146-154); and the RO stress method (156-162) side by side. In the DC HCI method, in item 136, the pre-stress characterization process takes place.

Then, in item 138, the DC HCI stress is calculated using various methods such as Vg, Vd, time, etc. In item 140, the post-stress characterization takes place to produce the DC HCI model in item 142, which in turn is used in the DC to AC HCI ratio based on transition times in item 144. In the AC HCI method the pre-stress characterization takes place in item 146. This is followed by an AC HCI stress test using various factors such as VDD, Vx, Δ, trise, tfall time, T, etc.; which produces a post-stress characterization in item 150. In item 152 the AC HCI model is produced, which is used in the DC to AC HCI ratio based on transition times (item 144); or used to determine device to circuit stress/life-time equivalence in item 154. In the RO stress, the pre-stress RO characterization takes place in item 156. Then, in item 158, the RO stress is calculated using various methods such as VDD, time, T etc. In item 160 the post-stress RO characterization takes place to produce an RO degradation model in item 162. This is then used to determine device to circuit stress/life-time equivalence in item 154.

Figure 15:
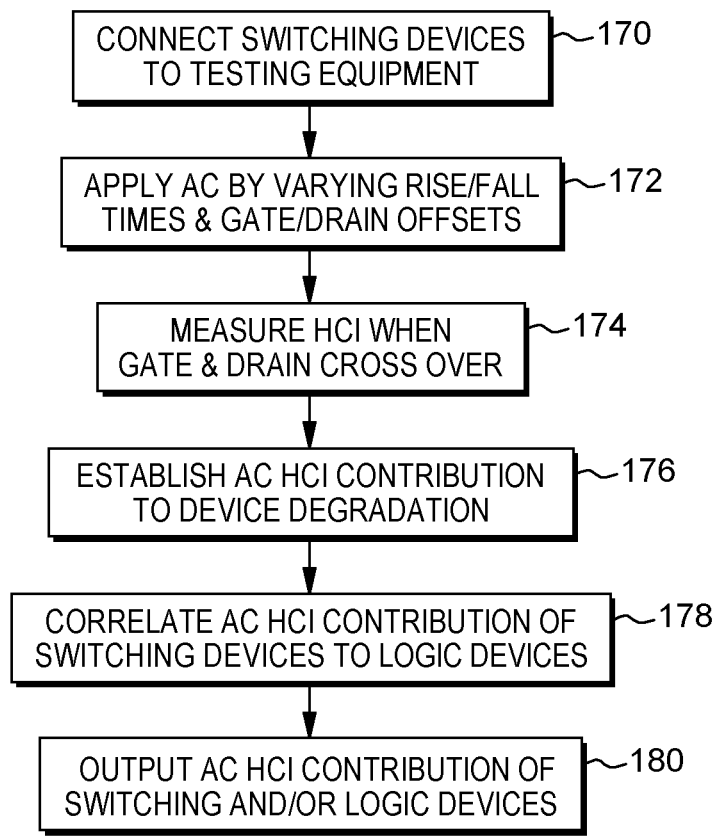

FIG. 15 demonstrates that various methods herein connect switching devices (e.g., CMOS switching devices) to testing equipment, in item 170, and apply alternating current (AC) to stress the CMOS switching devices using the testing equipment in item 172. As shown in item 172, the methods herein control the testing equipment to cause, in response to applied AC, variations in rise and fall times of drain and gate voltages of the switching devices and variations in offsets of the drain and gate voltages (independently of one another). For example, in item 172, the testing equipment can vary the rise and fall times, and the offsets, of the drain and gate voltages (independently of each other) using synchronized sense amplifier units. Similarly, the testing equipment can be controlled to independently vary the frequency of the AC in item 172.

As shown in item 174, such methods can measure the amount of hot carrier injection (HCI) within the CMOS switching devices when the rise and fall times of the drain and gate voltages cross over, to (in item 176) establish AC HCI contribution to device degradation of the CMOS switching devices. The drain and gate voltages cross over at the point where the testing equipment applies the same voltage to drains and gates of the CMOS switching devices, and this is the point at which the highest AC stress voltage is applied to the CMOS switching devices.

Since the rise and fall times, and the offsets, of the drain and gate voltages are varied independently of one another in item 172, this produces a range of cross-over voltages at which the drain and gate voltages cross over; and this allows the methods to establish a range of AC HCI contributions for the range of cross-over voltages in item 176. The process of establishing the AC HCI contribution in item 176 can, for example, take an integral of cross-over voltages within the range of cross-over voltages. Also, the measurement of the amount of HCI in item 174 can be performed for p-type field effect transistor devices (pFETs) and n-type field effect transistor devices (nFETs), to establish the AC HCI contribution separately for the pFETs and nFETs.

Further, in item 178, these methods can correlate the AC HCI contribution of the CMOS switching devices to CMOS logic devices based on ring oscillator (RO) degradation of ROs similarly tested or simulated under the same conditions and inputs, to produce AC HCI contribution for the CMOS logic devices; and the AC HCI contribution for the CMOS switching devices and/or the AC HCI contribution for the CMOS logic devices can be output from the testing equipment, as shown in item 180.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

Figure 16:
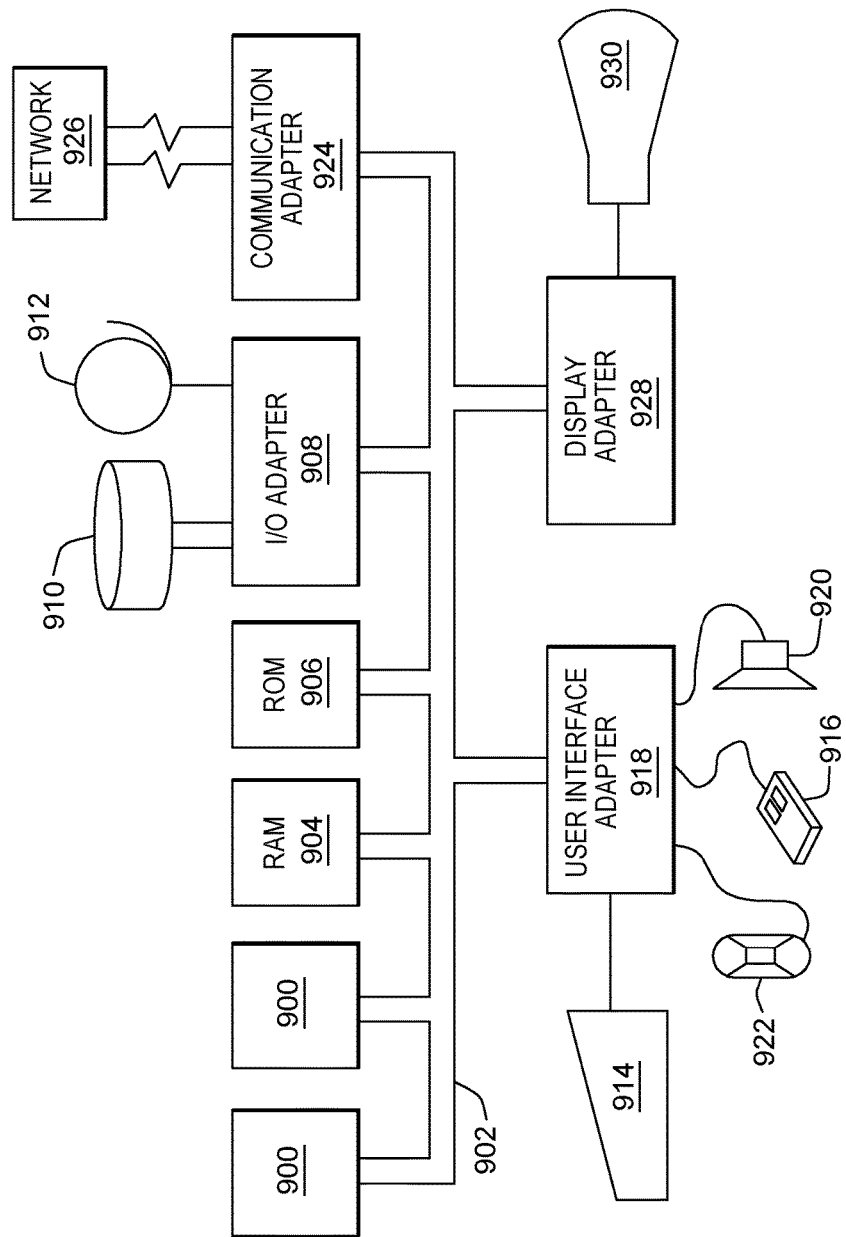
FIG. 16 is a schematic diagram of a hardware system according to embodiments herein.

A representative hardware environment (i.e., a computer system) for implementing the systems, methods and computer program products disclosed above is depicted in FIG. 16. This schematic drawing illustrates a hardware configuration of an information handling/computer system in accordance with the embodiments herein. The system incorporates at least one processor or central processing unit (CPU) 900. The CPUs 900 are interconnected via a system bus 902 to various devices such as a random access memory (RAM) 904, read-only memory (ROM) 906, and an input/output (I/O) adapter 908. The I/O adapter 908 can connect to peripheral devices, such as disk units 910 and tape drives 912, or other program storage devices that are readable by the system. The system can read the inventive instructions on the program storage devices and follow these instructions to execute the methodology of the embodiments herein. The system further includes a user interface adapter 918 that connects a keyboard 914, mouse 916, speaker 920, microphone 922, and/or other user interface devices such as a touch screen device (not shown) to the bus 902 to gather user input. Additionally, a communication adapter 924 connects the bus 902 to a data processing network 926, and a display adapter 928 connects the bus 902 to a display device 930 which may be embodied as an output device such as a monitor, printer, or transmitter, for example.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method of merging one or more non-transactional stores and one or more thread-specific transactional stores into one or more cache line templates in a store buffer in a store cache. In other words, one or more computer hardware devices can be created that are configured to implement the method and processes described herein with reference to the Figures and their corresponding descriptions.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:
connecting complementary metal oxide semiconductor (CMOS) switching devices to testing equipment;
applying alternating current (AC) to stress the CMOS switching devices using the testing equipment;
controlling the testing equipment to cause, in response to applied AC, variations in rise and fall times of drain and gate voltages of the switching devices and variations in offsets of the drain and gate voltages;
measuring an amount of hot carrier injection (HCI) within the CMOS switching devices when rise and fall times of the drain and gate voltages cross over, to establish AC HCI contribution to device degradation of the CMOS switching devices; and
outputting the AC HCI contribution for the CMOS switching devices from the testing equipment.

2. The method according to claim 1, the controlling of the testing equipment varies the rise and fall times of the drain and gate voltages, and varies the offsets of the drain and gate voltages independently of one another to produce a range of cross-over voltages at which the drain and gate voltages cross over, to establish a range of AC HCI contributions for the range of cross-over voltages.

3. The method according to claim 2, wherein establishing the range of AC HCI contributions takes an integral of cross-over voltages within the range of cross-over voltages.

4. The method according to claim 1, the testing equipment varies the rise and fall times of the drain and gate voltages, and varies the offsets of the drain and gate voltages using synchronized sense amplifier units.

5. The method according to claim 1, when the rise and fall times of the drain and gate voltages cross over, the highest AC stress voltage is applied to the CMOS switching devices.

6. The method according to claim 1, the measuring of the amount of HCI is performed for p-type field effect transistor devices (pFETs) and n-type field effect transistor devices (nFETs), to establish the AC HCI contribution separately for the pFETs and nFETs of the CMOS switching devices.

7. The method according to claim 1, the controlling of the testing equipment further comprises independently varying the frequency of the AC applied to the CMOS switching devices.

8. A method comprising:
connecting complementary metal oxide semiconductor (CMOS) switching devices to testing equipment;
applying alternating current (AC) to stress the CMOS switching devices using the testing equipment;
controlling the testing equipment to cause, in response to applied AC, variations in rise and fall times of drain and gate voltages of the switching devices and variations in offsets of the drain and gate voltages;
measuring an amount of hot carrier injection (HCI) within the CMOS switching devices when rise and fall times of the drain and gate voltages cross over, the drain and gate voltages cross over at a point where the testing equipment applies the same voltage to drains and gates of the CMOS switching devices, to establish AC HCI contribution to device degradation of the CMOS switching devices;
correlating the AC HCI contribution of the CMOS switching devices to CMOS logic devices based on ring oscillator (RO) degradation of ROs similarly tested under the same conditions and inputs, to produce AC HCI contribution for the CMOS logic devices; and
outputting the AC HCI contribution for the CMOS logic devices from the testing equipment.

9. The method according to claim 8, the controlling of the testing equipment varies the rise and fall times of the drain and gate voltages, and varies the offsets of the drain and gate voltages independently of one another to produce a range of cross-over voltages at which the drain and gate voltages cross over, to establish a range of AC HCI contributions for the range of cross-over voltages.

10. The method according to claim 9, wherein establishing the range of AC HCI contributions takes an integral of cross-over voltages within the range of cross-over voltages.

11. The method according to claim 8, the testing equipment varies the rise and fall times of the drain and gate voltages, and varies the offsets of the drain and gate voltages using synchronized sense amplifier units.

12. The method according to claim 8, when the rise and fall times of the drain and gate voltages cross over, the highest AC stress voltage is applied to the CMOS switching devices.

13. The method according to claim 8, the measuring of the amount of HCI is performed for p-type field effect transistor devices (pFETs) and n-type field effect transistor devices (nFETs), to establish the AC HCI contribution separately for the pFETs and nFETs of the CMOS switching devices.

14. The method according to claim 8, the controlling of the testing equipment further comprises independently varying the frequency of the AC applied to the CMOS switching devices.

15. A testing system comprising:
testing equipment;
a controller connected to the testing equipment; and
an input/output connected to the controller,
the testing equipment is connectable to complementary metal oxide semiconductor (CMOS) switching devices, and capable of applying alternating current (AC) to stress the CMOS switching devices,
the controller is capable of controlling the testing equipment to cause, in response to applied AC, variations in rise and fall times of drain and gate voltages of the switching devices and variations in offsets of the drain and gate voltages,
the controller is capable of measuring an amount of hot carrier injection (HCI) within the CMOS switching devices when rise and fall times of the drain and gate voltages cross over, the drain and gate voltages cross over at a point where the testing equipment applies the same voltage to drains and gates of the CMOS switching devices, to establish AC HCI contribution to device degradation of the CMOS switching devices,
the controller is capable of correlating the AC HCI contribution of the CMOS switching devices to CMOS logic devices based on ring oscillator (RO) degradation of ROs similarly tested under the same conditions and inputs, to produce AC HCI contribution for the CMOS logic devices, and
the input/output is capable of outputting the AC HCI contribution for the CMOS logic devices from the testing equipment.

16. The testing system according to claim 15, the controller is capable of controlling the testing equipment to vary the rise and fall times of the drain and gate voltages, and vary the offsets of the drain and gate voltages independently of one another to produce a range of cross-over voltages at which the drain and gate voltages cross over, to establish a range of AC HCI contributions for the range of cross-over voltages.

17. The testing system according to claim 16, the controller is capable of establishing the range of AC HCI contributions by taking an integral of cross-over voltages within the range of cross-over voltages.

18. The testing system according to claim 15, the testing equipment comprises synchronized sense amplifier units capable of varying the rise and fall times of the drain and gate voltages, and varying the offsets of the drain and gate voltages.

19. The testing system according to claim 15, when the rise and fall times of the drain and gate voltages cross over, the highest AC stress voltage is applied to the CMOS switching devices.

20. The testing system according to claim 15, the controller is capable of measuring the amount of HCI for p-type field effect transistor devices (pFETs) and n-type field effect transistor devices (nFETs), to establish the AC HCI contribution separately for the pFETs and nFETs of the CMOS switching devices.

* * * * *